(12) United States Patent
Kim et al.

(10) Patent No.: US 7,825,490 B2
(45) Date of Patent: *Nov. 2, 2010

(54) ELECTRICAL FUSE HAVING A CAVITY THEREUPON

(75) Inventors: Deok-kee Kim, Bedford Hills, NY (US); Wai-Kin Li, Beacon, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 411 days.

This patent is subject to a terminal disclaimer.

(21) Appl. No.: 11/779,424

(22) Filed: Jul. 18, 2007

(65) Prior Publication Data

US 2009/0021338 A1 Jan. 22, 2009

(51) Int. Cl.
*H01L 29/93* (2006.01)
(52) U.S. Cl. .............................. 257/529; 257/E23.149
(58) Field of Classification Search ................. 257/529, 257/530, 528, E23.147, E23.149, 499, E23.146
See application file for complete search history.

(56) References Cited

U.S. PATENT DOCUMENTS

| 5,899,736 | A | 5/1999 | Weigand et al. |
| 6,274,440 | B1 | 8/2001 | Arndt et al. |
| 2006/0256160 | A1* | 11/2006 | Ozaki et al. .................. 347/54 |
| 2009/0026574 | A1* | 1/2009 | Kim et al. .................. 257/529 |

* cited by examiner

*Primary Examiner*—Sue Purvis
*Assistant Examiner*—Selim Ahmed
(74) *Attorney, Agent, or Firm*—Scully, Scott, Murphy & Presser, P.C.; Yuanmin Cai

(57) ABSTRACT

An electrical fuse is formed on a semiconductor substrate and a first dielectric layer is formed over the electrical fuse. At least one opening is formed by lithographic methods and a reactive ion etch in the first dielectric layer down to a top surface of the electrical fuse or down to shallow trench isolation. A second dielectric layer is deposited by a non-conformal deposition. Thickness of the second dielectric layer on the sidewalls of the at least one opening increases with height so that at least one cavity encapsulated by the second dielectric layer is formed in the at least one opening. The at least one cavity provides enhanced thermal isolation of the electrical fuse since the cavity provides superior thermal isolation than a dielectric material.

12 Claims, 17 Drawing Sheets

ELECTRICAL FUSE HAVING A CAVITY THEREUPON

FIELD OF THE INVENTION

The present invention relates to semiconductor structures, and particularly to an electrical fuse having at least one cavity thereupon and methods of manufacturing the same.

BACKGROUND OF THE INVENTION

Electrical fuses (eFuses) are used in the semiconductor industry to implement array redundancy, field programmable arrays, analog component trimming circuits, and chip identification circuits. Once programmed, the programmed state of an electrical fuse does not revert to the original state on its own, that is, the programmed state of the fuse is not reversible. For this reason, electrical fuses are called One-Time-Programmable (OTP) memory elements.

The mechanism for programming an electrical fuse is electromigration of a metal semiconductor alloy induced by an applied electrical field and an elevated temperature on a portion of the electrical fuse structure. The metal semiconductor alloy is electromigrated under these conditions from the portion of the electrical fuse structure, thereby increasing the resistance of the electrical fuse structure. The rate and extent of electromigration during programming of an electrical fuse is dependent on the temperature and the current density at the electromigrated portion.

An electrical fuse typically comprises an anode, a cathode, and a fuselink. The fuselink is a narrow strip of a conductive material adjoining the anode and cathode. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material, which may comprise a metal silicide.

In general, the higher the temperature of the fuselink, the easier it is to electromigrate the conductive material, i.e., the less current is needed to induce electromigration. Since programming of electrical fuses typically takes a substantial amount of current, for example, a programming current of about 5 mA for an electrical fuse having a fuselink width of about 63 nm, it is advantageous to provide effective thermal isolation to the fuselink to keep the temperature of the fuselink elevated during the programming.

While fuselinks of conventional electrical fuses are insulated by dielectric materials so that heat loss from the fuselink is contained during programming of the electrical fuse, improved thermal isolation of the fuselink and a higher temperature during programming would reduce the amount of electrical current needed for programming the electrical fuse. Such a reduction in the electrical current needed for programming would allow reduction of the size of a programming transistor.

Further, performance of many semiconductor devices may be adversely impacted by a high temperature, for example, through diffusion of dopants or decomposition of a thermally susceptible material. Semiconductor devices located around an electrical fuse needs to be protected from the high temperature generated during programming of the electrical fuse.

In view of the above, there exists a need for an electrical fuse structure having improved thermal isolation from surrounding semiconductor structures, and especially having improved thermal isolation around a fuselink, and methods of manufacturing the same.

SUMMARY OF THE INVENTION

The present invention addresses the needs described above by providing an electrical fuse having at least one cavity around the electrical fuse, wherein the at least one cavity provides enhanced thermal isolation of the electrical fuse compared with dielectric materials, and methods of manufacturing the same.

An electrical fuse is formed on a semiconductor substrate and a first dielectric layer is formed over the electrical fuse. At least one opening is formed by lithographic methods and a reactive ion etch in the first dielectric layer down to a top surface of the electrical fuse or down to shallow trench isolation. The at least one opening has at least one lateral dimension that is less than one half, and preferably less than one third, of the height of the first dielectric layer. A second dielectric layer is deposited by a non-conformal deposition. Thickness of the second dielectric layer on the sidewalls of the at least one opening increases with height so that at least one cavity encapsulated by the second dielectric layer is formed in the at least one opening. The at least one cavity provides enhanced thermal isolation of the electrical fuse since the cavity provides superior thermal isolation than a dielectric material. The electrical fuse may be programmed with less programming current and semiconductor devices nearby are protected from adverse thermal effects during programming.

According to an aspect of the present invention, a semiconductor structure is provided, which comprises:

an electrical fuse comprising a first electrode, a second electrode, and a fuselink, and located on shallow trench isolation in a semiconductor substrate, wherein each of the first electrode, the second electrode, and the fuselink comprises a conductive material;

at least one cavity located on and above the fuselink; and a dielectric layer encapsulating the at least one cavity and vertically abutting the fuselink.

In one embodiment, the at least one cavity is separated from the fuselink by a sublithographic dimension.

In another embodiment, the semiconductor structure further comprises another dielectric layer vertically abutting the electrical fuse and containing at least one opening that extends to a top surface of the electrical fuse and laterally abuts the dielectric layer.

In even another embodiment, the semiconductor structure further comprises a dielectric spacer laterally abutting sidewalls of the electrical fuse, wherein the at least one cavity is located above a portion of the dielectric spacer.

In yet another embodiment, the at least one cavity is located above a portion of the shallow trench isolation.

In still another embodiment, the at least one cavity is separated from the dielectric spacer by a sublithographic dimension.

According to another aspect of the present invention, another semiconductor structure is provided, which comprises:

an electrical fuse comprising a first electrode, a second electrode, and a fuselink, and located on shallow trench isolation in a semiconductor substrate, wherein each of the first electrode, the second electrode, and the fuselink comprises a conductive material;

at least one cavity located in proximity to the electrical fuse and above the shallow trench isolation; and a dielectric layer encapsulating the at least one cavity and vertically abutting the shallow trench isolation.

In one embodiment, the semiconductor structure further comprises a dielectric spacer located on sidewalls of the electrical fuse, wherein the at least one cavity is separated from the electrical fuse by a distance not exceeding the sum of a width of the fuselink and twice a width of the dielectric spacer.

In another embodiment, the semiconductor structure further comprises a semiconductor device laterally abutting the shallow trench isolation, wherein the at least one cavity is located between the electrical fuse and the semiconductor device.

In even another embodiment, the at least one cavity laterally surrounds the electrical fuse.

In yet another embodiment, the at least one cavity is located over at least a portion of the fuselink.

In still another embodiment, the at least one cavity is a pair of cavities located on both sides of the fuselink.

According to yet another aspect of the present invention, a method of forming a semiconductor structure is provided, which comprises:
   forming an electrical fuse comprising a first electrode, a second electrode, and a fuselink on shallow trench isolation in a semiconductor substrate;
   forming a first dielectric layer on the electrical fuse;
   forming at least one opening in the first dielectric layer by etching the first dielectric layer and exposing at least one of a top surface of the electrical fuse and a top surface of the shallow trench isolation around the electrical fuse; and
   depositing a second dielectric layer and forming at least one cavity within the first dielectric layer, wherein the second dielectric layer extends into and encapsulates the at least one cavity.

In one embodiment, the at least one cavity is separated from the at least one of the top surface of the electrical fuse and the top surface of the shallow trench isolation around the electrical fuse by a sublithographic distance.

In another embodiment, the depositing of the second dielectric layer is a non-conformal process that deposits less material on a lower portion than on a top portion within the at least one opening, and the at least one cavity has an arched top portion.

In even another embodiment, the method further comprises forming a dielectric spacer directly on sidewalls of the electrical fuse, wherein the at least one cavity is formed above the dielectric spacer and is separated from the dielectric spacer by a portion of the second dielectric layer by a sublithographic thickness.

In yet another embodiment, the at least one cavity is formed over portions of the shallow trench isolation adjacent to the dielectric spacer.

In still another embodiment, the method further comprises forming at least one semiconductor device, wherein the at least one cavity is formed between the electrical fuse and the at least one semiconductor device on the shallow trench isolation.

In still yet another embodiment, the at least one cavity laterally surrounds outer sidewalls of the electrical fuse.

In a further embodiment, the at least one cavity has at least two topological handles, and at least two portions of the second insulator layer is laterally surrounded by the at least one cavity.

In an even further embodiment, the at least one opening comprises a lithographic minimum dimension as seen in a top-down view.

In a yet further embodiment, the method may further comprise forming a dielectric cap layer on the first dielectric layer prior to forming the at least one opening in the first dielectric layer.

In a still further embodiment, the method further comprises forming another at least one opening overlapping the at least one opening in the dielectric cap layer.

In a still yet further embodiment, the dielectric cap layer comprises a dielectric material that is one of a silicon oxide and a silicon nitride.

In further another embodiment, the first dielectric layer comprises a first dielectric material selected from the group consisting of a silicon oxide, a silicon nitride, a chemical vapor deposition (CVD) low-k dielectric material, and a spin-on low-k dielectric material.

In even further another embodiment, the second dielectric layer comprises a second dielectric material selected from the group consisting of a silicon oxide, a silicon nitride, and a chemical vapor deposition (CVD) low-k dielectric material.

DETAILED DESCRIPTION OF THE INVENTION

Figure 1A:
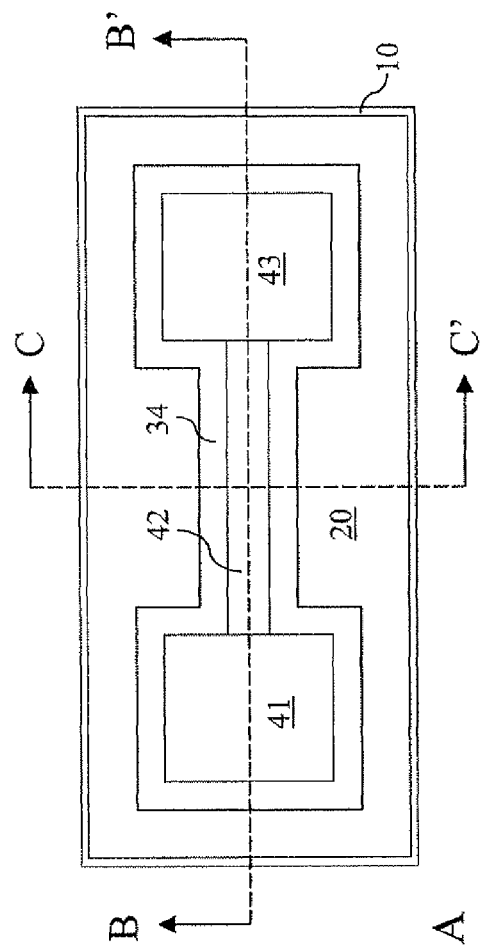
FIGS. 1A-5C are sequential views of a first exemplary structure according to a first embodiment of the present invention. Figures with the same numeric label correspond to the same stage of manufacturing; figures with the suffix "A" are top-down views; figures with the suffix "B" or "C" are vertical cross-sectional views along the plane B-B' or the plan C-C', respectively, of the corresponding figure with the same numeric label and the suffix "A."

As stated above, the present invention relates to an electrical fuse having at least one cavity thereupon, which is now described in detail with accompanying figures. It is noted that like and corresponding elements are referred to by like reference numerals.

Figure 1C:
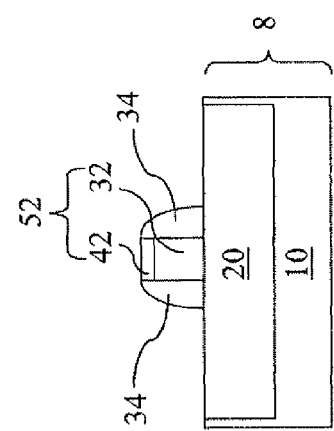
Figure 1B:
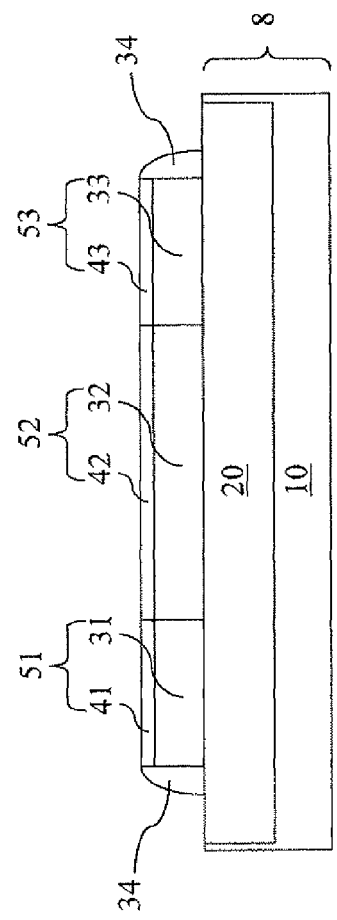

Referring to FIGS. 1A-1C, a first exemplary structure according to the present invention comprises an electrical fuse formed on a semiconductor substrate 8 comprising a substrate layer 10 and shallow trench isolation 20. Preferably, the entirety of the electrical fuse is formed over the shallow trench isolation 20 and does not abut the substrate layer 10 to minimize heat loss during programming.

The electrical fuse comprises a first electrode 51, a second electrode 53, and a fuselink 52. Each of the first electrode 51, the second electrode 53, and the fuselink 52 comprises a conductive material that may be electromigrated. The conductive material may be a metal semiconductor alloy such as a metal silicide or a metal germanide, and/or a semiconductor material such as silicon, a silicon containing alloy, a germanium containing alloy, a III-V compound semiconductor, or a II-IV semiconductor. Preferably, the conductor material comprises a stack of a semiconductor material and a metal semiconductor alloy. For example, the conductor material may comprise a stack of polysilicon and a metal silicide. The polysilicon may, or may not, be doped. While the present invention is described for a case in which the conductor material comprises a stack of a semiconductor material and a metal semiconductor alloy, embodiments in which the conductive material consists of a semiconductor material or a metal semiconductor alloy are also contemplated herein.

During programming of the electrical fuse (51, 52, 53), a voltage bias is applied across the first electrode 51 and the second electrode 53. The electrode to which a relatively positive bias voltage is applied during the programming is typically called an "anode," while the other electrode to which a relatively negative voltage bias is applied is called a "cathode." Thus, one of the first electrode 51 and the second electrode 53 is the anode and the other is the cathode.

The first electrode 51 comprises a first electrode semiconductor portion 31 and a first electrode metal semiconductor alloy portion 41. Likewise, the second electrode 53 comprises a second electrode semiconductor portion 33 and a second electrode metal semiconductor alloy portion 43. The fuselink 52 comprises a fuselink semiconductor portion 32 and a fuselink metal semiconductor alloy portion 42.

The semiconductor substrate 8 may be a bulk substrate, a semiconductor-on-insulator (SOI) substrate, or a hybrid substrate. The semiconductor substrate 8 may have a built-in biaxial stress in the plane of the semiconductor substrate 8, i.e., in the plane perpendicular to the surface normal of the top surface of the semiconductor substrate 8. While the present invention is described with a bulk substrate, implementation of the present invention on an SOI substrate or on a hybrid substrate is explicitly contemplated herein.

The semiconductor substrate 8 is patterned for a shallow trench and filled with an insulator material. By planarizing and optionally recessing the insulator material, the shallow trench isolation 20 is formed in the semiconductor substrate 8. The portion of the semiconductor substrate containing a semiconductor material constitutes the substrate layer 10. The substrate layer 10 may comprise a semiconductor material such as amorphous silicon, epitaxial silicon, single crystal silicon, silicon germanium alloy, silicon carbon alloy, silicon carbon germanium alloy, a III-V compound semiconductor, or a II-VI compound semiconductor. The semiconductor material may be substantially undoped, doped with p-type dopants, or doped with n-type dopants.

The electrical fuse (51, 52, 53) is typically formed at the same time as a gate stack during processing steps of a semiconductor manufacturing sequence. The gate stack comprises a gate semiconductor material and a gate metal semiconductor alloy. While a different semiconductor material may be employed for the electrical fuse (51, 52, 53) than the gate semiconductor material, use of the same semiconducting material for both the gate semiconductor material and the electrical fuse (51, 52, 53) is in general preferred. Likewise, while a different metal semiconductor alloy material may be employed for the electrical fuse (51, 52, 53) than the gate metal semiconductor alloy, use of the same metal semiconductor alloy for both the gate metal semiconductor alloy and the electrical fuse (51, 52, 53) is in general preferred.

The first electrode semiconductor portion 31, the second electrode semiconductor portion 33, and the fuselink semiconductor portion 32 comprise a semiconductor material that may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material may be doped with electrical dopants, or undoped. The thickness of the various semiconductor portions (31, 32, 33) may be from about 10 nm to about 300 nm, and typically from about 50 nm to about 120 nm, although lesser and greater thicknesses are also contemplated herein. Different portions of the electrical fuse (51, 52, 53) may comprise semiconductor materials having different dopants.

Each of the first electrode metal semiconductor alloy portion 41, the second electrode metal semiconductor alloy portion 43, and the fuselink metal semiconductor alloy portion 42 comprises a metal semiconductor alloy. In case the first electrode semiconductor portion 31, the second electrode semiconductor portion 33, and the fuselink semiconductor portion 32 comprise silicon, the first electrode metal semiconductor alloy portion 41, the second electrode metal semiconductor alloy portion 44, and the fuselink metal semiconductor alloy portion 43 may comprise a metal silicide such as nickel silicide ($NiSi_x$), cobalt silicide ($CoSi_x$), tantalum silicide ($TaSi_x$), and titanium silicide ($TiSi_x$), tungsten silicide ($WSi_x$), platinum silicide ($PtSi_x$) or alloys thereof. Values of x may be typically between 1 and 3. A metal nitride such as $TaN_x$, $TiN_x$, or $WN_x$ may be employed instead of a metal silicide as well.

A dielectric material is conformally deposited on sidewalls of the electrical fuse (51, 52, 53) and etched by a reactive ion etch to from a dielectric spacer 34. The dielectric spacer 34 abuts sidewalls of the electrical fuse (51, 52, 53), i.e., sidewalls of the first electrode 51, the second electrode 52, and the fuselink 52. The dielectric spacer 34 surrounds the electrical fuse (51, 52, 53) and is topologically homeomorphic to a torus, i.e., may be continuously stretched and bent into a torus.

Figure 2A:
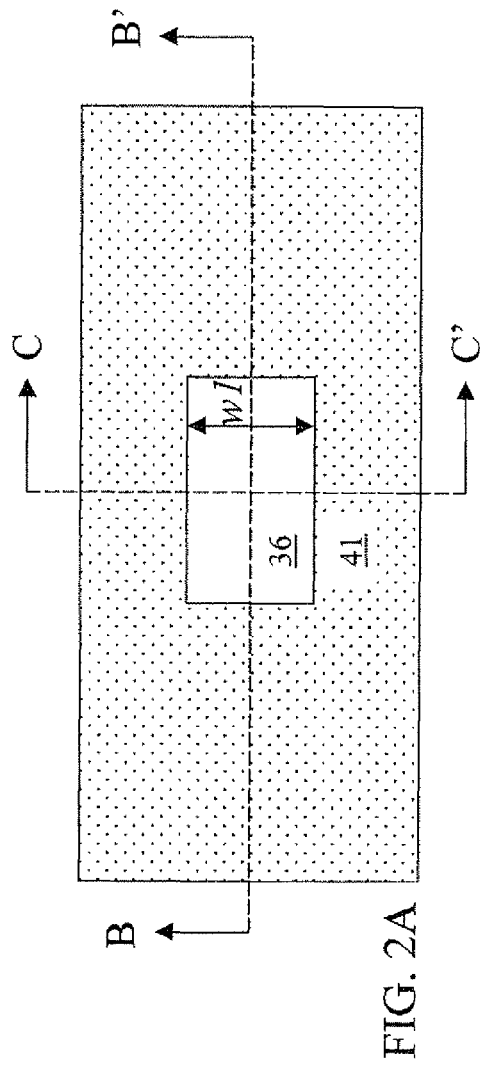
Figure 2C:
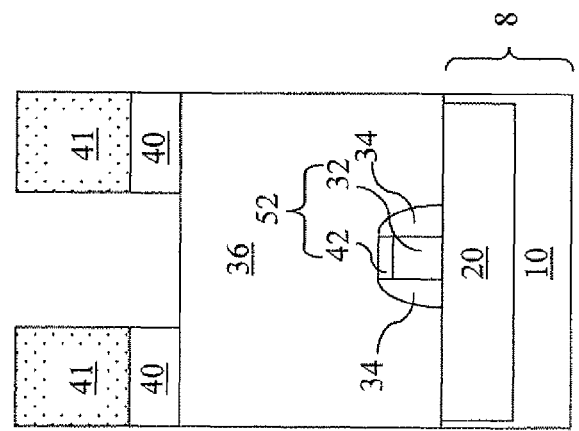
Figure 2B:
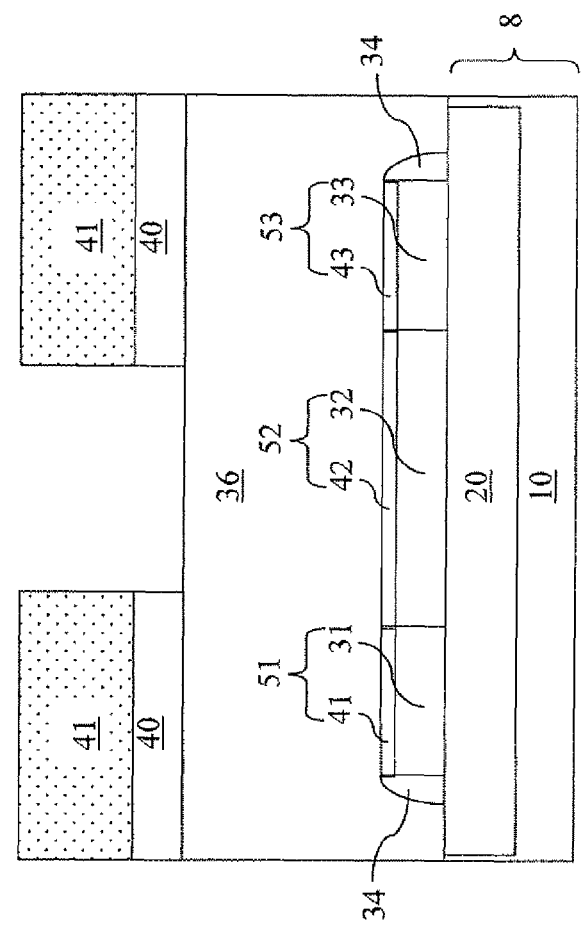

Referring to FIGS. 2A-2C, a first dielectric layer 36 comprising a first dielectric material is formed on the electrical fuse (51, 52, 53). The first dielectric layer 36 abuts the top surfaces of the electrical fuse (51, 52, 53) and the sidewall of the dielectric spacer 34. The first dielectric material may comprise a silicon oxide, a silicon nitride, a chemical vapor deposition (CVD) low-k dielectric material, or a spin-on low-k dielectric material.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

The CVD low-k dielectric material may be a SiCOH dielectric containing a matrix of a hydrogenated oxidized silicon carbon material (SiCOH) comprising atoms of Si, C, O and H in a covalently bonded tri-dimensional network. The CVD low-k dielectric material can be porous or nonporous. Such CVD low-k dielectric material has a dielectric constant of not more than about 2.8 and typically comprises between about 5 and about 40 atomic percent of Si; between about 5 and about 45 atomic percent of C; between 0 and about 50 atomic percent of O; and between about 10 and about 55 atomic percent of H. The tri-bonded network may include a covalently bonded tri-dimensional ring structure comprising Si—O, Si—C, Si—H, C—H and C—C bonds. Further, the CVD low-k dielectric material may comprise F and N and may optionally have the Si atoms partially substituted by Ge atoms. The CVD low-k dielectric material may contain molecular scale voids (i.e., nanometer-sized pores) of between about 0.3 to about 50 nanometers in diameter, and most preferably between about 0.4 and about 10 nanometers in diameter, further reducing the dielectric constant of the first dielectric layer 36 to values below about 2.0.

The spin-on low-k dielectric material has a dielectric constant of about 3.0 or less, preferably less than about 2.8, and more preferably less than about 2.5. The spin-on low-k dielectric material can be porous or nonporous. An example of the spin-on low-k dielectric material is a thermosetting polyarylene ether, which is also commonly referred to as "Silicon Low-K", or "SiLK." The term "polyarylene" denotes aryl moieties or inertly substituted aryl moieties which are linked together by bonds, fused rings, or inert linking groups such as oxygen, sulfur, sulfone, sulfoxide, carbonyl, etc.

The first dielectric layer 36 may be self-planarizing as in the case of the spin-on low-k dielectric material, or may be planarized as needed. Typical thickness of the first dielectric layer 36 as measured from a top surface of the semiconductor substrate 8, i.e., from the interface between the shallow trench isolation and the electrical fuse (51, 52, 53), may be from about 200 nm to about 600 nm, and typically from about 300 nm to about 450 nm.

An optional dielectric cap layer 40 may be deposited on the first dielectric layer 40. The thickness of the optional dielectric cap layer 40 may be from about 5 nm to about 200 nm, and typically from about 20 nm to about 50 nm. The optional dielectric cap layer 40 may comprise a silicon oxide, a silicon nitride, or a stack thereof. In a variation of the first embodiment, the optional dielectric cap layer is omitted so that the photoresist 41 is applied directly on the first dielectric layer 36.

A photoresist 41 is applied on the optional dielectric cap layer 40 and lithographically patterned to expose a portion of the optional dielectric cap layer 40 over the fuselink 52. An opening having a lithographic dimension is patterned in the photoresist 41. The opening may be rectangular and may have a first lithographic width w1 in the direction perpendicular to the direction between the first electrode 51 and the second electrode 53. The first lithographic width w1 may be greater than the sum of the width of the fuselink 52 and twice the width of the dielectric spacer 34. The width of the dielectric spacer 34 is measured at the base of the dielectric spacer 34.

In general, the opening may be elliptical or rectangular. In case the opening is elliptical, the lengths of major axis and the minor axis of the ellipse are lithographic dimensions. The opening may be a circle, in which case the major and minor axes are the same and is a diameter of a circle. In case the opening is rectangular, the length and width of the rectangle are lithographic dimensions.

The first lithographic width w1 may be greater than a "lithographic minimum dimension," which is also called a "critical dimension," or may be equal to the lithographic minimum dimension. While the lithographic minimum dimension or the critical dimension are defined only in relation to a lithography tool and normally changes from generation to generation of semiconductor technology, it is understood that the lithographic minimum dimension and the critical dimension are to be defined in relation to the best performance of lithography tools available at the time of semiconductor manufacturing. As of 2007, the lithographic minimum dimension is about 50 nm and is expected to shrink in the future. Any dimension less than the lithographic minimum dimension is called a "sublithographic dimension."

Figure 3C:
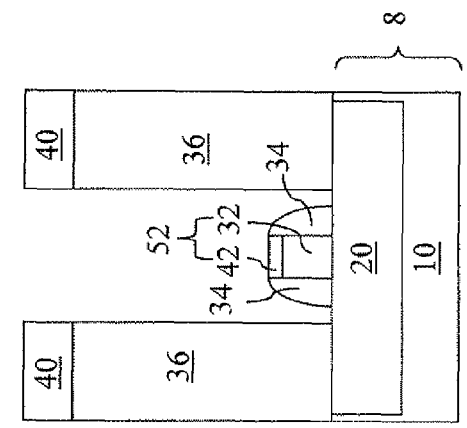
Figure 3A:
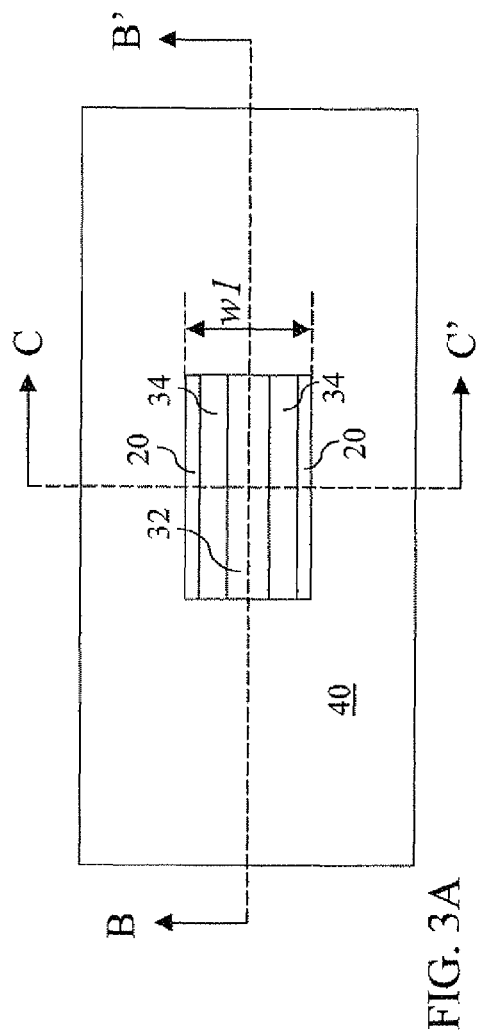
Figure 3B:
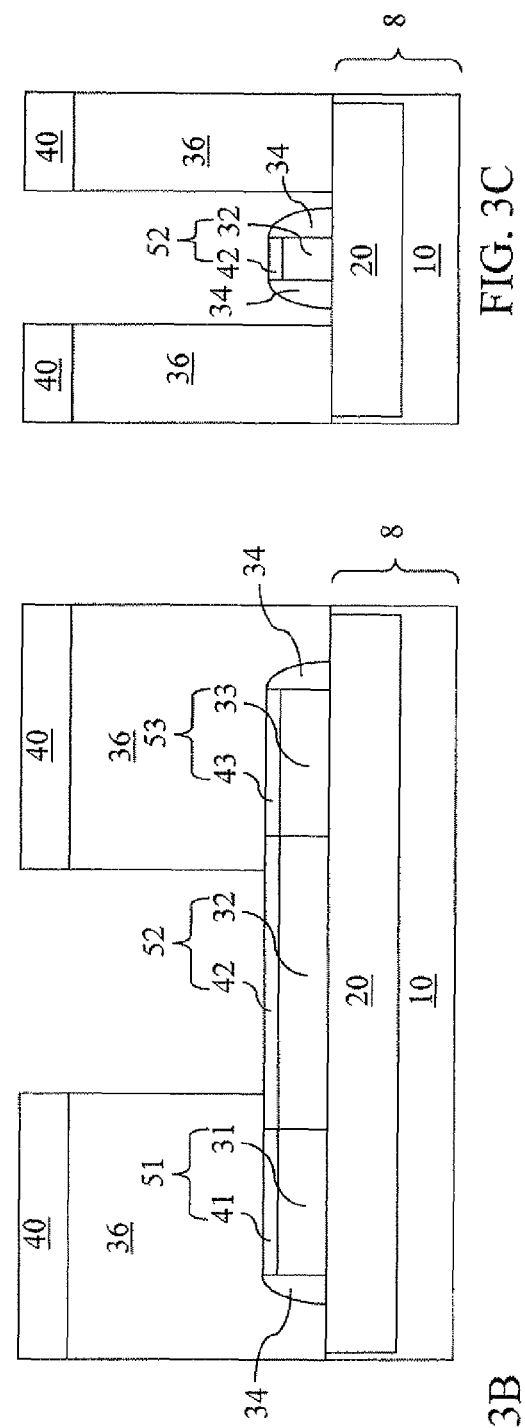

Referring to FIGS. 3A-3C, the pattern of the opening in the photoresist 41 is transferred into the optional dielectric cap layer 40 by a reactive ion etch to form an opening in the optional dielectric cap layer 40 having substantially the same dimensions as the opening in the photoresist 41. The pattern of the opening in the photoresist 41 is further transferred into the first dielectric layer 36 by another reactive ion etch. A top surface of the fuselink 52, a top surface of portions of the dielectric spacer 34, and a top surface of portion of the shallow trench isolation 20 are exposed within the opening in the first dielectric layer 36. The opening in the first dielectric layer 36 has substantially the same lateral dimensions as the opening in the photoresist 41. The opening in the first dielectric layer 36 is located above portions of the dielectric spacer 34 abutting the fuselink 52 and portions of the shallow trench isolation 20 adjacent to the dielectric spacer 34. After formation of the opening in the first dielectric layer 36, the photoresist 41 is removed, for example, by ashing.

The ratio between the thickness of the first dielectric layer 36 to a lateral dimension of the opening in the first dielectric layer 36, hereafter to be referred to as the "aspect ratio of the opening," exceeds 2, and preferably exceeds 3, and more preferably, exceeds 4. The lateral dimension of the opening in the first dielectric layer 36 may be first lithographic width w1, which may be in the range from about 50 nm to about 150 nm. The aspect ratio of the opening may be from about 2 to about 12, and typically from about 3 to 4.5.

Figure 4A:
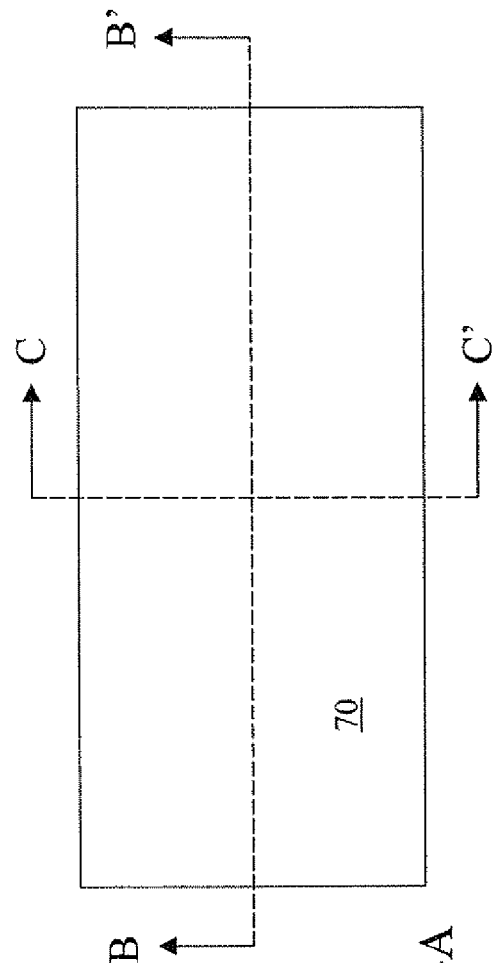
Figure 4C:
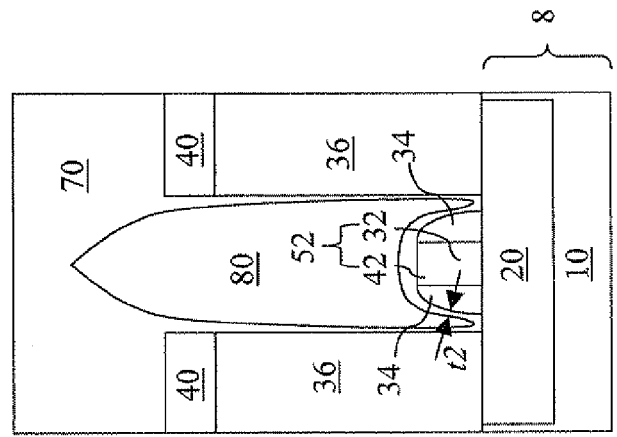
Figure 4B:
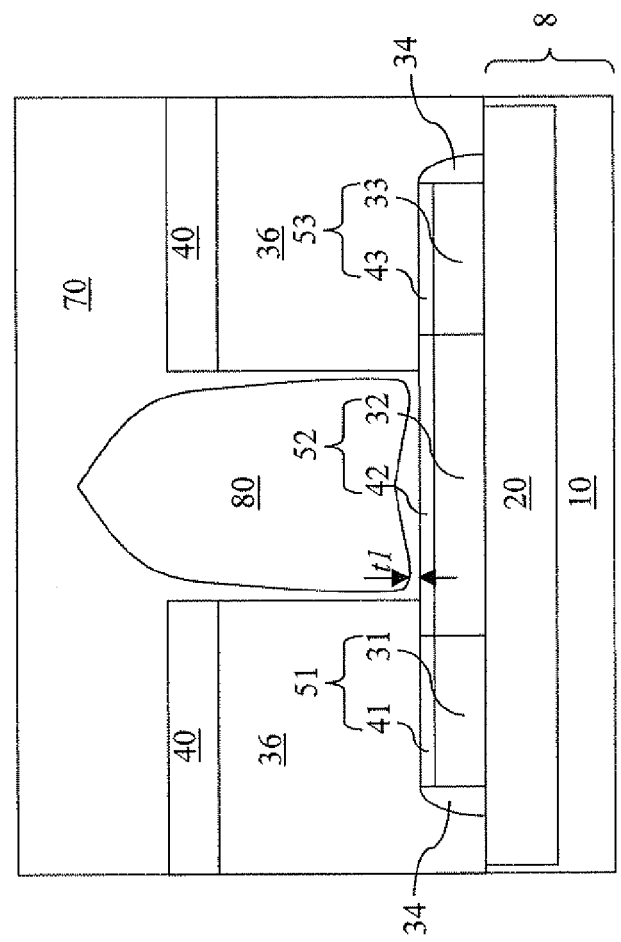

Referring to FIGS. 4A-4C, a second dielectric layer 70 is deposited on the first dielectric layer 36 and/or the optional dielectric cap layer 40. The second dielectric layer 70 may comprise a silicon oxide, a silicon nitride, or a chemical vapor deposition (CVD) low-k dielectric material. Exemplary materials for the silicon oxide, the silicon nitride, and the CVD low-k dielectric material are as described above.

The second dielectric layer 70 is deposited by a non-conformal deposition, i.e., the deposition process is depletive and mass flow limited. The second dielectric material may, or may not be, the same material as the first dielectric material. Due to the high aspect ratio of the opening in the first dielectric layer 36, only a thin layer of second dielectric material is deposited on the sidewalls and bottom surfaces of the opening in the first dielectric layer 36, while the top surface of the first dielectric layer 36 accumulates a second dielectric material to cover the opening in the first dielectric layer 36. A cavity 80 that is encapsulated, i.e., completely surrounded without any opening, by the second dielectric material is formed within the opening in the first dielectric layer 36. The second dielectric material extends into the opening within the first dielectric layer 36 and encapsulates the cavity 80.

Near the top of the opening in the first dielectric layer 36, the thickness of the second dielectric material on the sidewalls of the opening increases with height until the cavity narrows down to a point. The top portion of the cavity 80 has an arched top. Depending on the shape of the opening, two tapered surfaces may meet to form a ridge at the arched top.

The cavity 80 may be separated from the fuselink 52 by a sublithographic dimension. This is because one of the lithographic dimensions such as the first lithographic width w1 is typically at a lithographic minimum dimension or close to a lithographic minimum dimension. Since step coverage, or the ratio of the thickness of the deposited material at a bottom of a recessed structure to a thickness of the deposited material near a top of a recessed structure, is low in a non-conformal deposition, the opening in the first dielectric layer 36 is sealed at the top of the opening to form the cavity 80 when the thickness of laterally deposited second dielectric material on the sidewalls of the opening reaches half of the separation between a pair of opposing sidewalls such as half of the first lithographic width w1. Therefore, the minimum of the thickness of the second dielectric material on the fuselink 52 in the first exemplary structure, or a "first thickness" t1, may be less than half of the separation between the pair of opposing sidewalls such as half of the first lithographic width w1. For a step coverage of $\alpha$ measured on top of the fuselink 52, the first thickness t1 is given by $\alpha/2 \times w1$, and thus, may be sublithographic.

The minimum separation between the cavity 80 and the dielectric spacer 34, or a "second thickness" t2, may also be less than half of the separation between the pair of opposing sidewalls such as half of the first lithographic width w1. For a step coverage of $\beta$ measured on top of the dielectric spacer 34, the second thickness t2 is given by $\beta/2 \times w1$, and thus, may be sublithographic. Similarly, the minimum separation between the cavity 80 and the shallow trench isolation may be sublithographic.

Figure 5A:
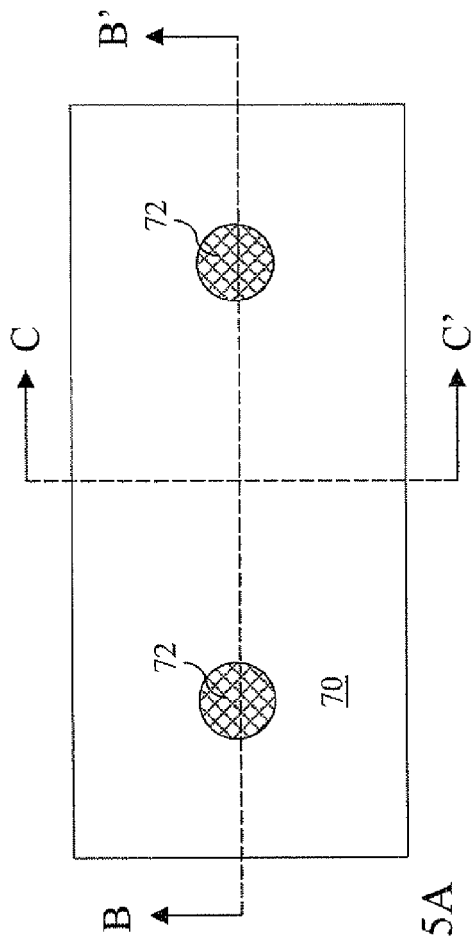
Figure 5C:
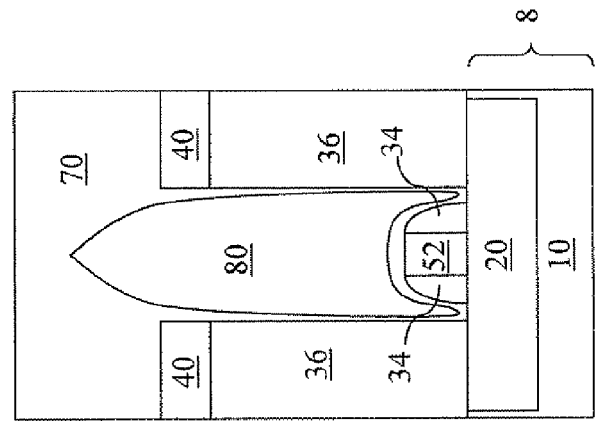
Figure 5B:
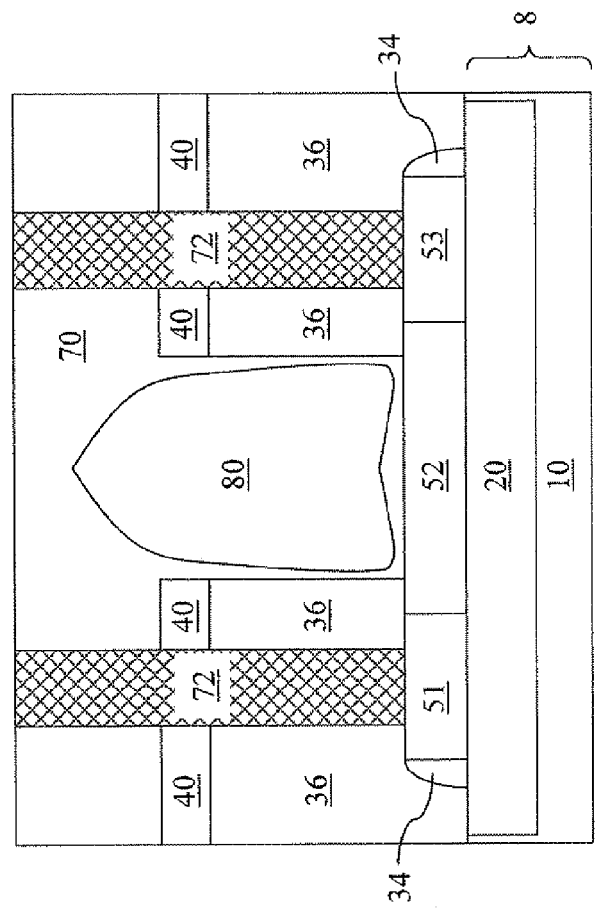

Referring to FIGS. 5A-5C, contact via holes are formed through the second dielectric layer 70, the optional dielectric cap layer 40, and the first dielectric layer 36 to the first electrode 51 and the second electrode 52, and filled with metal to form metal contact vias 72.

The cavity 80 provides enhanced thermal insulation to the fuselink 52 than any dielectric material since virtually no heat flows through the cavity 80 by conduction. Thus, the fuselink 52 is better thermally insulated from surrounding structures and capable of maintaining a higher temperature during programming of the electrical fuse (51, 52, 53). A more reliable programming may be performed at a higher temperature than conventional electrical fuses employing thermal insulation by a dielectric material without cavities. Alternatively, a smaller programming current may be supplied from a smaller programming transistor so that the temperature during programming is comparable with the temperature during programming of a conventional electrical fuse that does not have a cavity thereupon. The smaller programming transistor has a less footprint than a conventional programming transistor.

In addition, the thin portion of the second dielectric material located directly above the fuselink 52 may be easily broken to relieve pressure in the fuselink 52 that may build up during electromigration. Thus, the cavity 80 serves as a reservoir of volume into which an electromigrated material from the fuselink 52 may flow during programming of the electrical fuse (51, 52, 53) to relieve pressure during the electromigration process, thus facilitating the electromigration of the material in the fuselink 52.

Variations of the first exemplary structure having multiple cavities 80 are explicitly contemplated herein.

Figure 6:
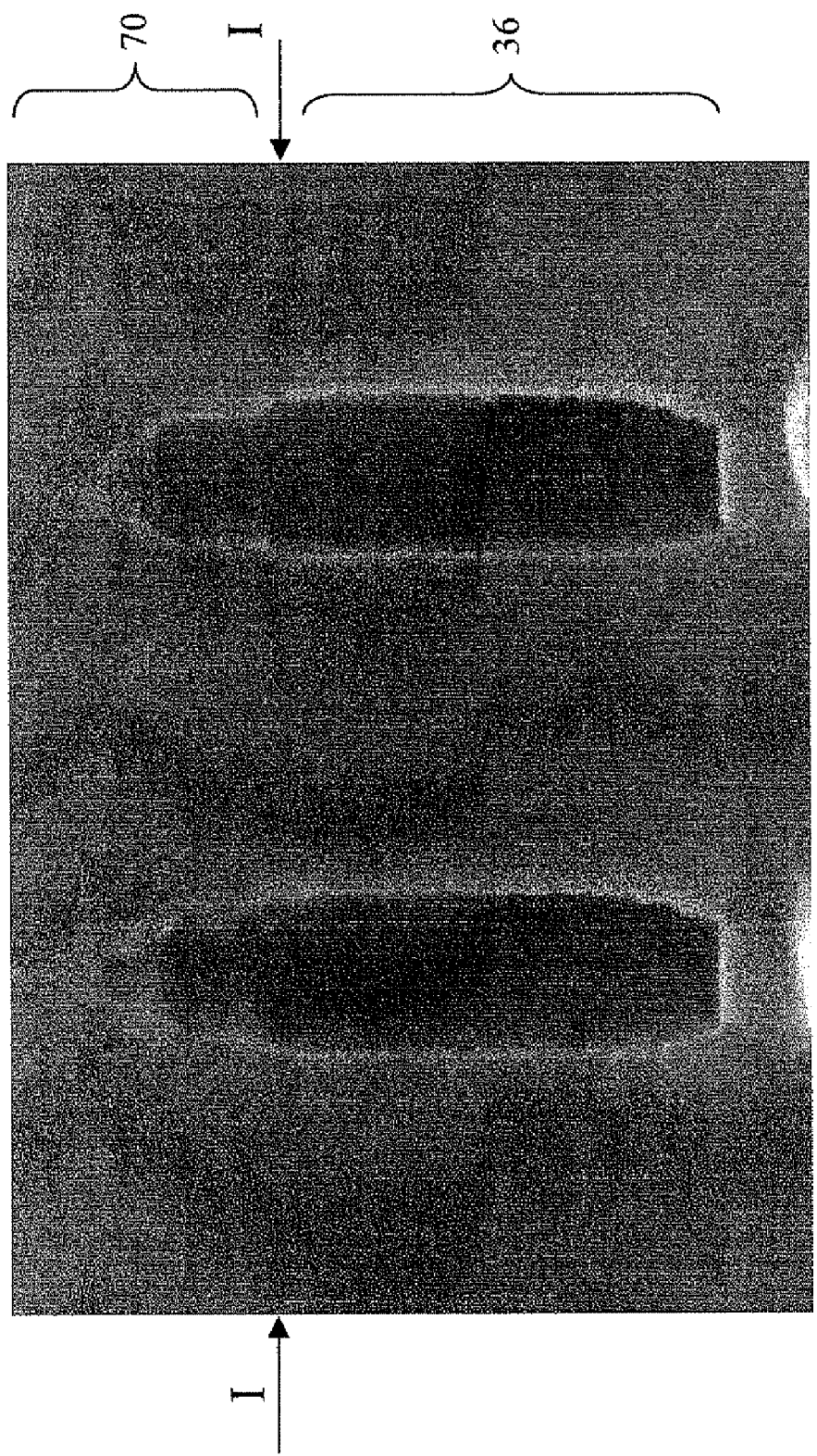
FIG. 6 is a scanning electron micrograph (SEM) of cavities formed in a stack of dielectric layers.

Referring to FIG. 6, a scanning electron micrograph (SEM) of a vertical cross-section of a semiconductor structure containing two cavities of the type described above is shown. The interface between a first dielectric material 36 and a second dielectric material 70 is marked by arrows labeled "I." The SEM shows an exemplary structure containing a cavity in a semiconductor structure.

A second exemplary structure according to a second embodiment of the present invention is derived from the first exemplary structure shown in FIGS. 2A-2C by reducing the first lithographic width w1. Specifically, the opening formed in the photoresist 41 (See FIGS. 2A-2C) has a second lithographic width w2 in the direction perpendicular to the direction between the first electrode 51 and the second electrode 53. The second lithographic width w2 is a lithographic dimension, i.e., is equal to or greater than the lithographic minimum dimension. The second lithographic dimension w2 is less than the sum of the width of the fuselink 52 and twice the width of the dielectric spacer 34.

Figure 7C:
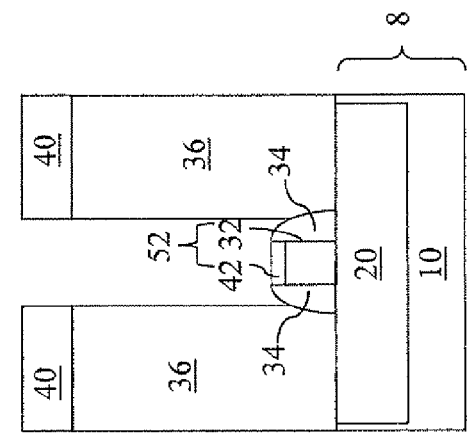
FIGS. 7A-8C are sequential views of a second exemplary structure according to a second embodiment of the present invention. Same figure naming conventions are employed for figure numerals and suffixes of FIGS. 7A-8C as for FIGS. 1A-5C.
Figure 7A:
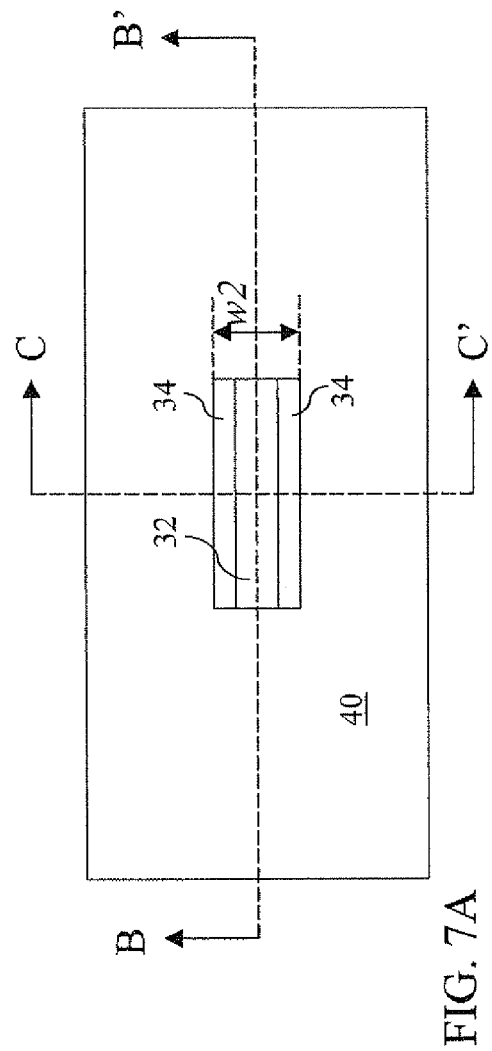
Figure 7B:
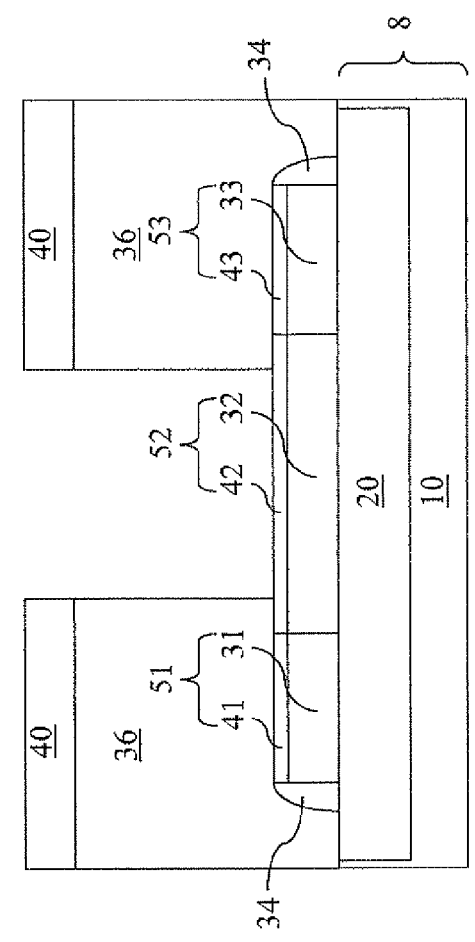

Referring to FIGS. 7A-7C, the optional dielectric cap layer 40 and the first dielectric layer 36 are etched to form an opening in the first dielectric layer 36 as in the first embodiment. A top surface of the fuselink 52 and a top surface of portions of the dielectric spacer 34 are exposed within the opening in the first dielectric layer 36 by a reactive ion etch. Unlike the first embodiment, however, the shallow trench isolation 20 is not exposed after the reactive ion etch. The opening in the first dielectric layer 36 has substantially the same lateral dimensions as the opening in the photoresist 41. The opening in the first dielectric layer 36 is located above portions of the dielectric spacer 34 abutting the fuselink 52, but does not extend above the shallow trench isolation 20. After formation of the opening in the first dielectric layer 36, the photoresist 41 is removed, for example, by ashing.

Figure 8A:
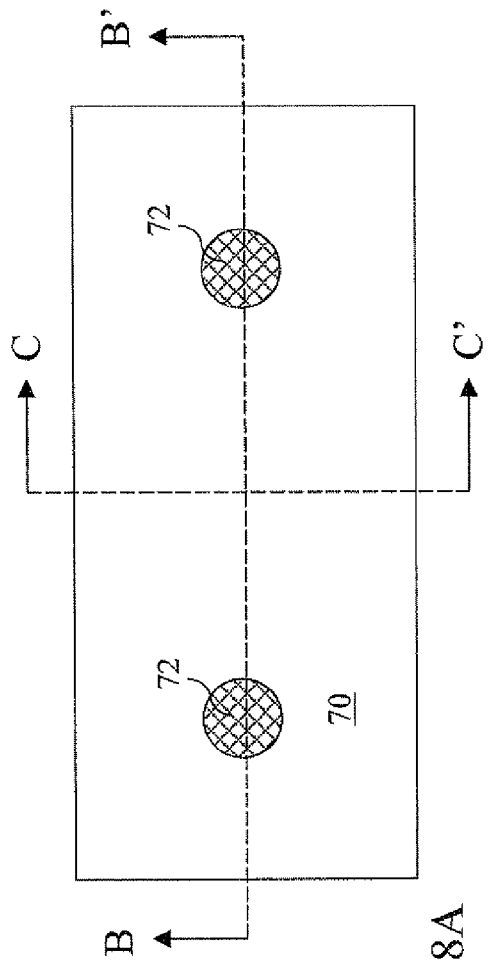
Figure 8C:
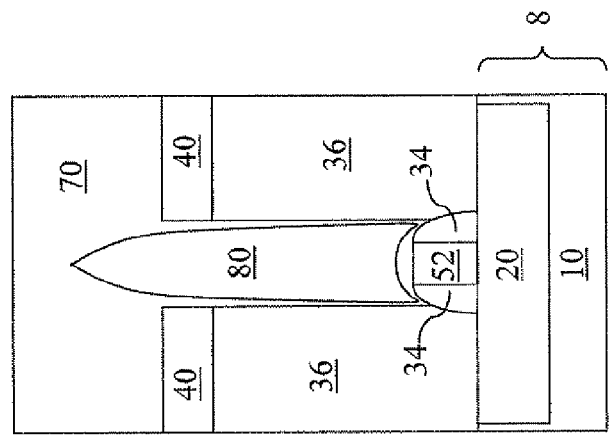
Figure 8B:
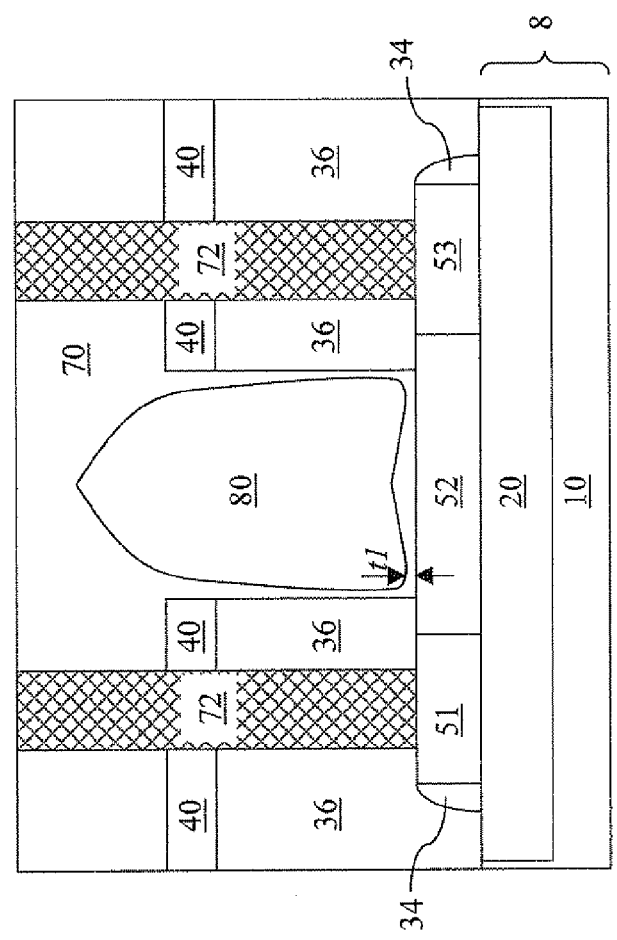

The same processing steps are employed thereafter in the second embodiment as in the first embodiment. The second exemplary structure in FIGS. 8A-8C has similar structural characteristics as the first exemplary structure in FIGS. 5A-5C. However, the cavity 80 is located only above a portion of the fuselink 52 and portions of the dielectric spacer 34, and does not extend above the shallow trench isolation 20. The cavity 80 provides enhanced thermal isolation to the electrical fuse (51, 52, 53) as in the first embodiment.

Figure 9C:
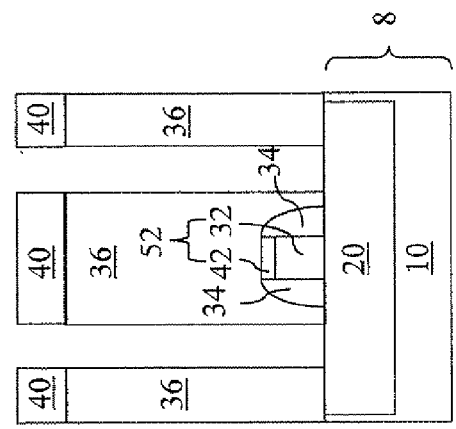
FIGS. 9A-10C are sequential views of a third exemplary structure according to a third embodiment of the present invention. Same figure naming conventions are employed for figure numerals and suffixes of FIGS. 9A-10C as for FIGS. 1A-5C.
Figure 9A:
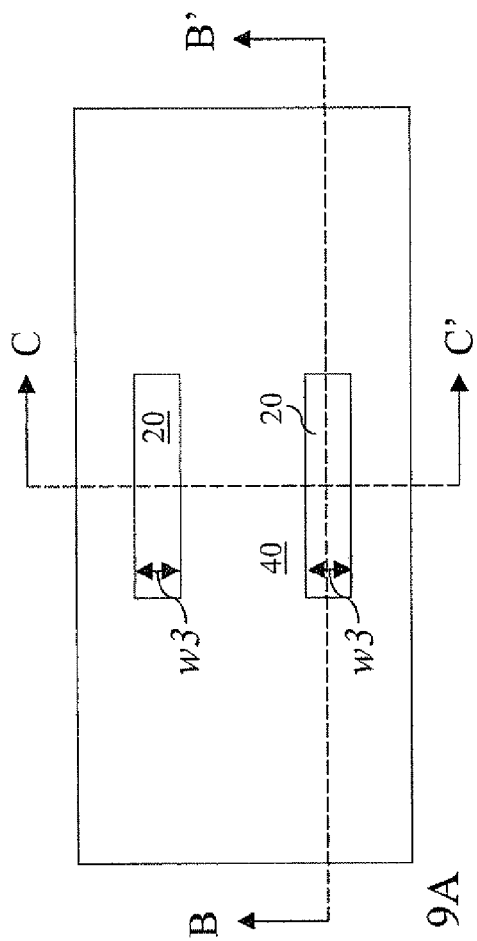
Figure 9B:
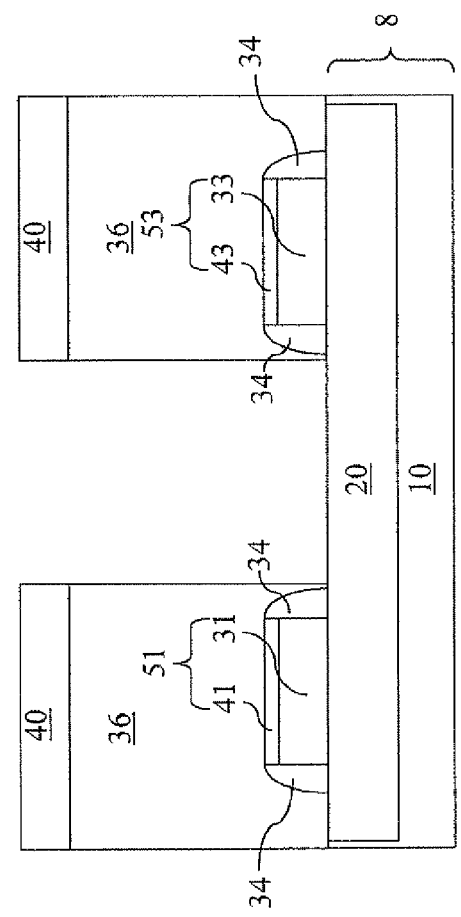

Referring to FIGS. 9A-9C, a pair of openings having a third lithographic dimension w3 are formed in the first dielectric layer 36 in a manner similar to the first and second embodiments. The third lithographic dimension w3 is a lithographic dimension. The pair of openings is formed on both sides of the fuselink 52. The sidewalls of the pair of openings may, or may not contact the dielectric spacer 34. Top surface of portions of the shallow trench isolation 20 is exposed after a reactive ion etch of the first dielectric layer 36. The fuselink portion 52 is not exposed after the reactive ion etch. The dielectric spacer 34 may, or may not, be exposed after the reactive ion etch.

Figure 10C:
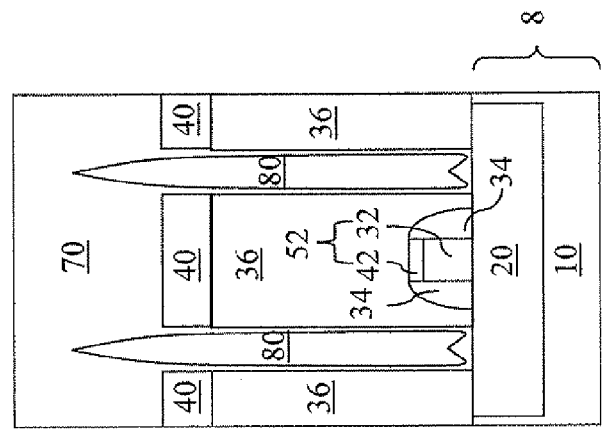
Figure 10A:
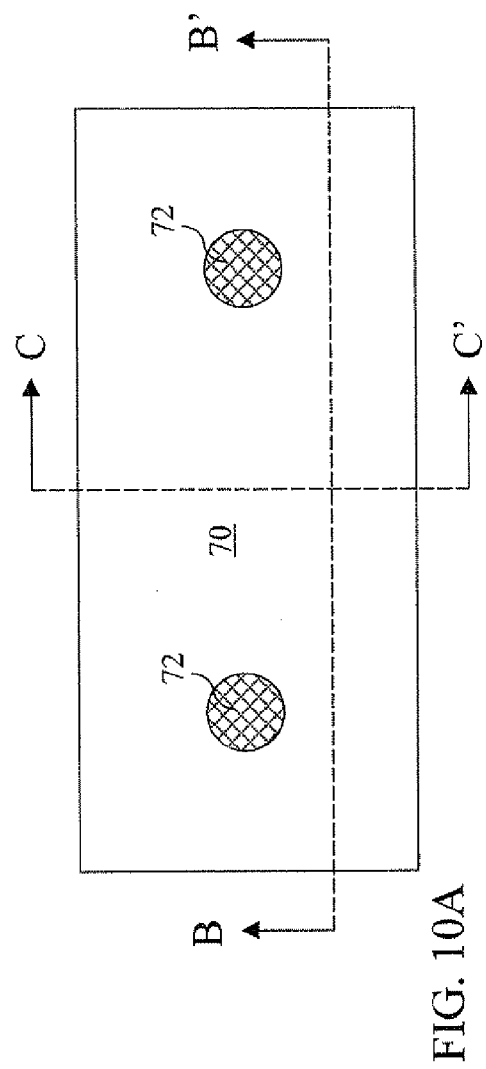
Figure 10B:
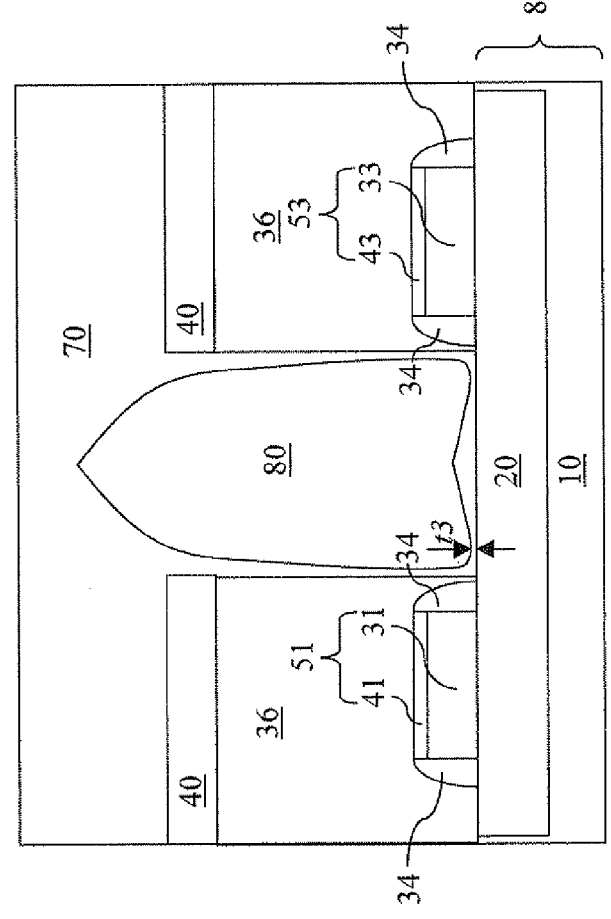

The same processing steps are employed thereafter in the third embodiment as in the first embodiment. The third exemplary structure in FIGS. 10A-10C comprises a pair of cavities 80 on both sides of the fuselink 52. The pair of cavities 80 is separated from the shallow trench isolation 20 by a third thickness t3 which may be a sublithographic dimension. The pair of cavities may be elongated along the direction of the fuselink 52, i.e., along the direction connecting the first electrode 51 and the second electrode 53. The pair of cavities 80 provides enhanced thermal isolation to the electrical fuse (51, 52, 53) as in the first embodiment.

Figure 11A:
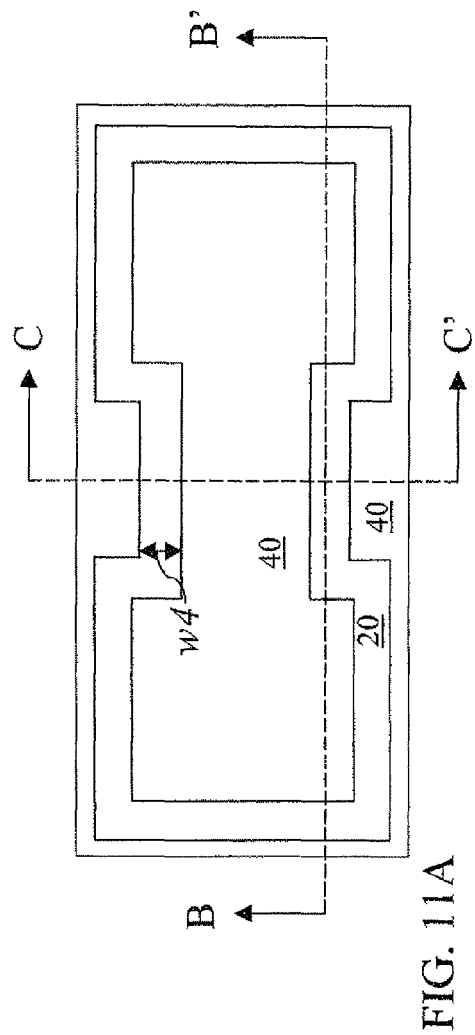
FIGS. 11A-12C are sequential views of a fourth exemplary structure according to a fourth embodiment of the present invention. Same figure naming conventions are employed for figure numerals and suffixes of FIGS. 11A-12C as for FIGS. 1A-5C.
Figure 11C:
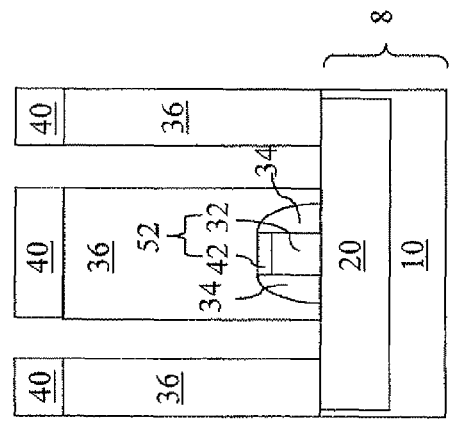
Figure 11B:
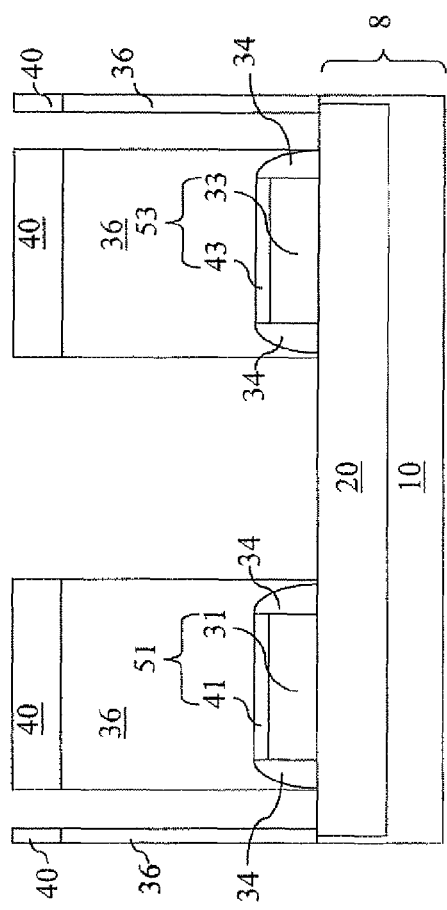

Referring to FIGS. 11A-11C, a fourth exemplary semiconductor structure is formed by lithographically patterning an opening in the first dielectric layer 36 around the periphery of the electrical fuse (51, 52, 53). The opening encircles, or laterally encloses, a portion of the first dielectric layer 36 located above the fuselink 52, the first electrode 51, and the second electrode 53. The opening may have substantially the same width, which is herein referred to as a fourth lithographic dimension w4, or may have a local variation. The width of the opening, i.e., the lateral dimension between two opposing sidewalls of the first dielectric layer in the opening, is lithographic.

Figure 12C:
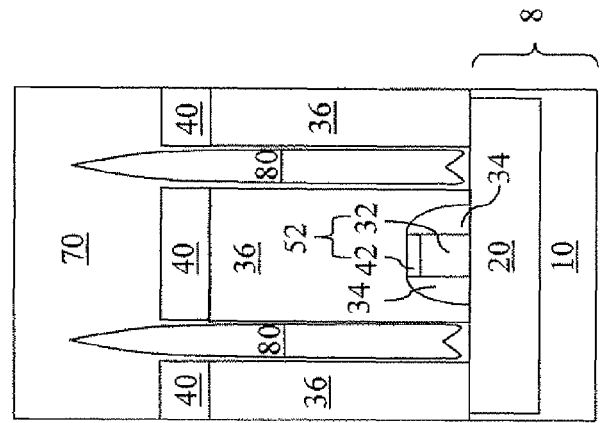
Figure 12A:
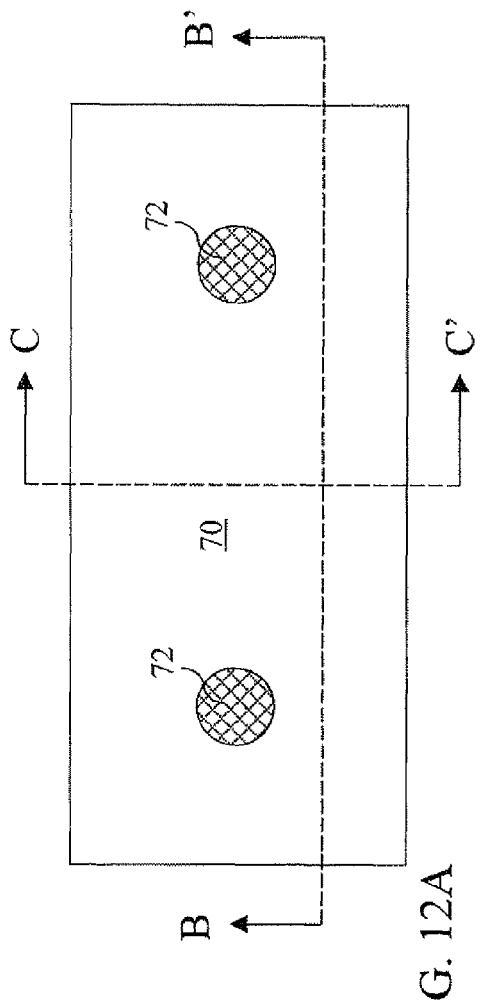
Figure 12B:
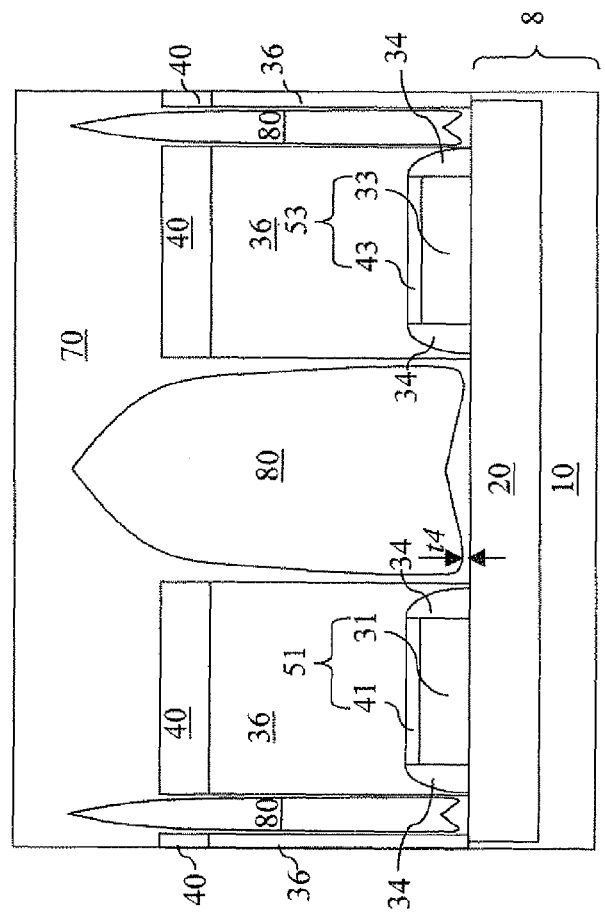

Referring to FIGS. 12A-12C, a cavity encircling the portion of the first dielectric layer located above the fuselink 52, the first electrode 51, and the second electrode 53 is formed by deposition of a second dielectric layer 70 as in the previous embodiments. The cavity 80 is separated from the shallow trench isolation 20 by a fourth thickness t4 which may be a sublithographic dimension. The fourth thickness t4 is the minimum thickness of the second dielectric layer 70 between the shallow trench isolation 20 and the cavity 80.

Topologically, the cavity 80 is homeomorphic to a torus, i.e., has one topological handle. Homeomorphism is a continuous stretching and bending of the object into a new shape without forming or destroying a singularity.

It is noted that in topology, which is a branch of mathematics, a handle is a subset of a topological object with at least one handle, in which the subset has the topology of a ball. The number of handles of a three-dimensional object is the minimum number of cuts one needs to make so that each of the disjoined subset of the three dimensional object may be topologically homeomorphic to a three dimensional ball. For example, the shape of a conventional coffee mug with one physical handle and the shape of a conventional donut with one hole have one topological handle. The shape of a vase with two physical handles has two topological handles.

The cavity 80 provides enhanced thermal isolation between the electrical fuse (51, 52, 53) and semiconductor structures surrounding the electrical fuse (51, 52, 53).

Figure 13C:
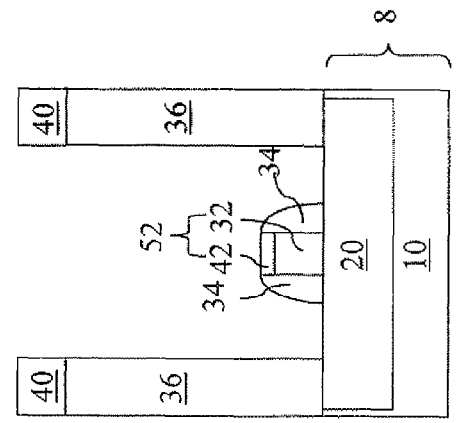
FIGS. 13A-14C are sequential views of a fifth exemplary structure according to a fifth embodiment of the present invention. Same figure naming conventions are employed for figure numerals and suffixes of FIGS. 13A-14C as for FIGS. 1A-5C.
Figure 13A:
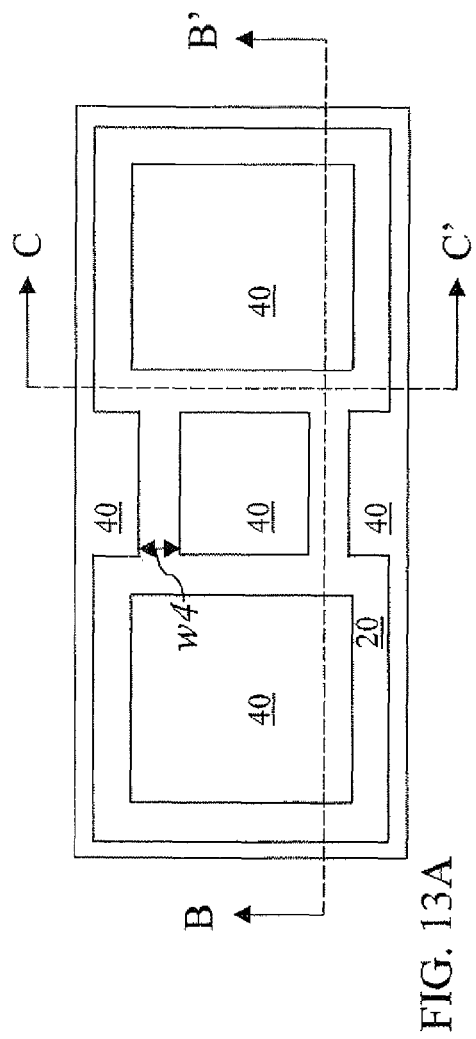
Figure 13B:
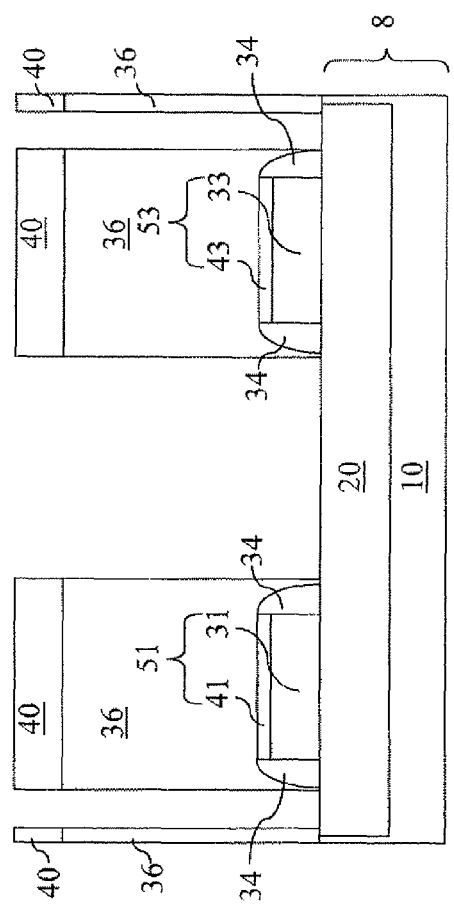

Referring to FIGS. 13 A-13C, a fifth exemplary semiconductor structure is formed by etching at least one additional volume of the first dielectric layer 36 connecting portion of the opening in the first dielectric layer 36 around the periphery of the electrical fuse (51, 52, 53) of the fourth exemplary structure in FIGS. 11A-11C. The cavity encircles a first portion of the first dielectric layer 36 located above the first electrode 51, a second portion of the first dielectric layer 36 located above the second electrode 52, and a third portion of the first dielectric layer 36 located above the fuselink 52. The opening in the first dielectric layer 36 comprises multiple trenches that are interconnected. The opening may have substantially the same width, which is the fourth lithographic dimension w4, or may have a local variation. The width of the opening, i.e., the lateral dimension between two opposing sidewalls of the first dielectric layer in the opening, is lithographic as in the fourth embodiment.

Figure 14A:
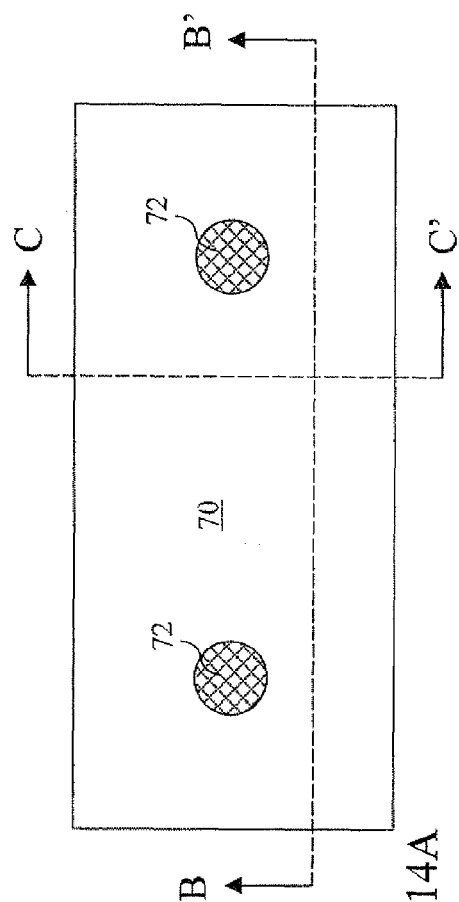
Figure 14C:
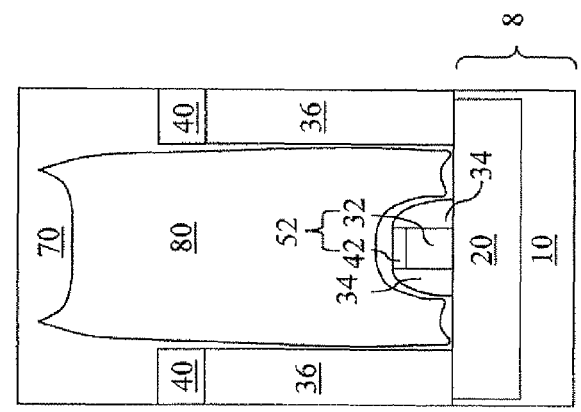
Figure 14B:
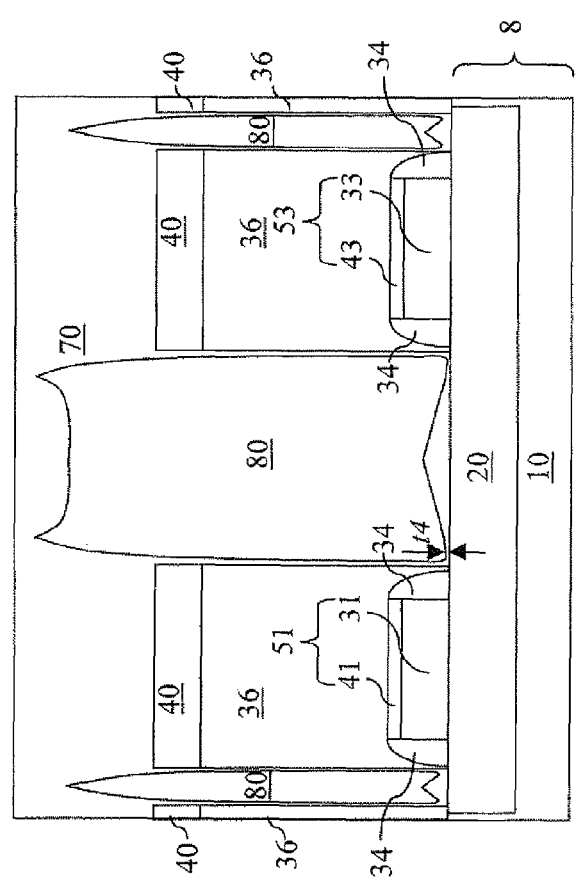

Referring to FIGS. 14A-14C, a cavity encircling the first portion of the first dielectric layer 36, the second portion of the first dielectric layer 36, and the third portion of the first dielectric layer 36 is formed by deposition of a second dielectric layer 70 as in the previous embodiments. The cavity 80 is separated from the shallow trench isolation 20 by a fourth thickness t4 which may be a sublithographic dimension. The fourth thickness t4 is the minimum thickness of the second dielectric layer 70 between the shallow trench isolation 20 and the cavity 80.

Topologically, the cavity 80 is has three handles, each handle comprising a portion of the cavity encircling one of the three portions of the first dielectric layer 36. In general, at least one interconnecting portion of the cavity 80 is present, and the cavity 80 has at least two topological handles. Variations of the fifth exemplary structure having less or more interconnecting portions of the cavity 80, and correspondingly, a less or greater number of topological handles in the cavity 80, are explicitly contemplated herein. The cavity 80 provides enhanced thermal isolation between the electrical fuse (51, 52, 53) and semiconductor structures surrounding the electrical fuse (51, 52, 53).

Figure 15A:
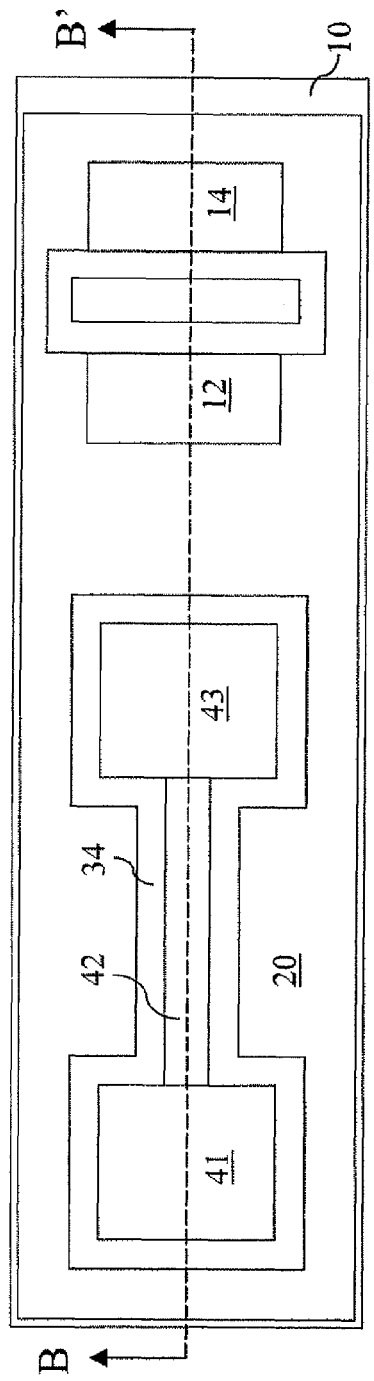
FIGS. 15A-17B are sequential views of a sixth exemplary structure according to a sixth embodiment of the present invention. Figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A."
Figure 15B:
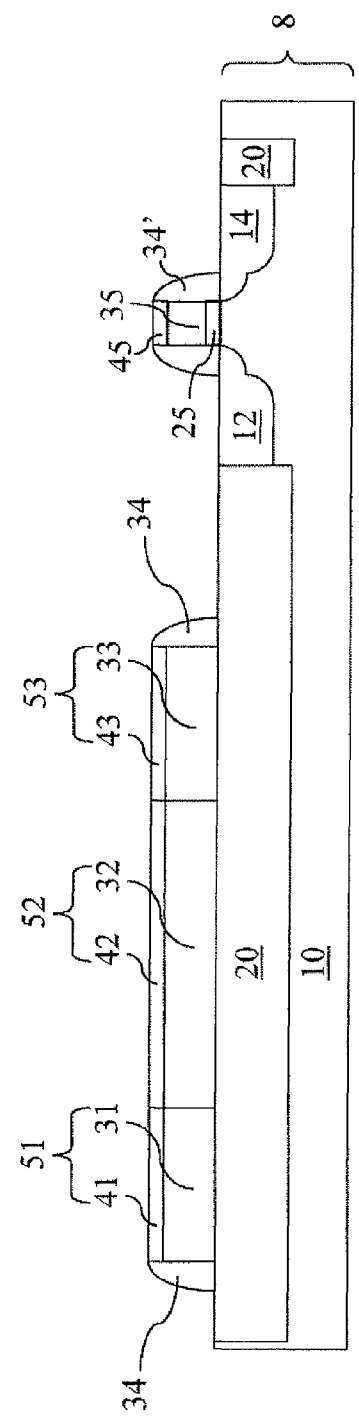

Referring to FIGS. 15A and 15B, a sixth exemplary structure comprises a semiconductor device laterally abutting shallow trench isolation 20 and an electrical fuse (51, 52, 53) located above the shallow trench isolation 20 is shown. The semiconductor device may be a field effect transistor having a source region 12, a drain region 14, a gate dielectric 25, a gate semiconductor 35, a gate metal semiconductor alloy 35, and a gate spacer 34'. The field effect transistor may be a programming transistor for the electrical fuse (51, 52, 53).

Figure 16A:
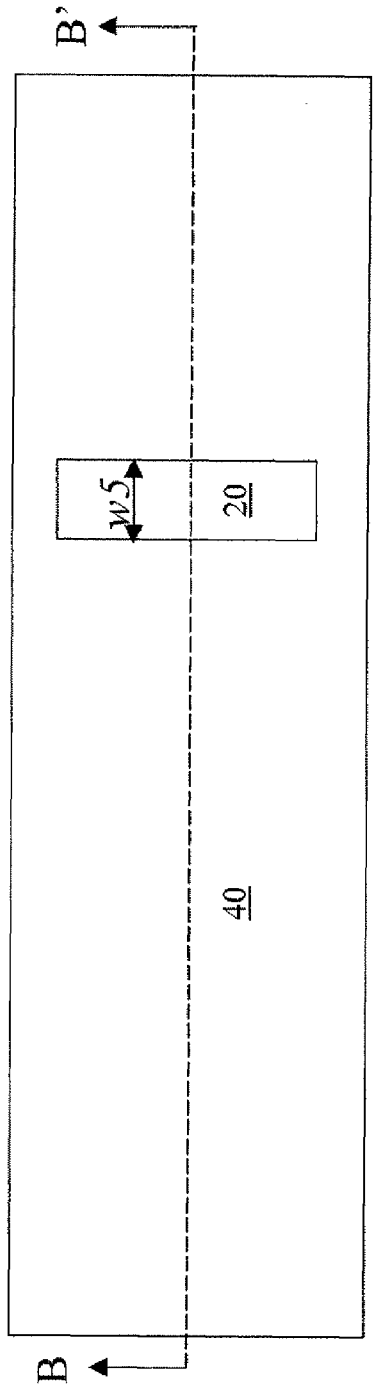
Figure 16B:
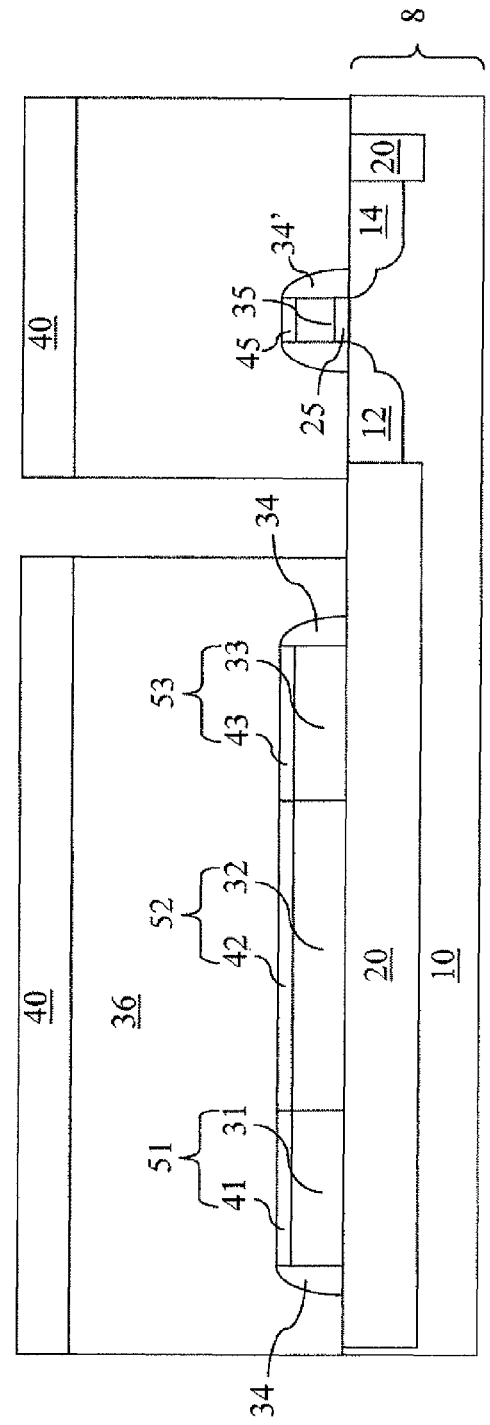

Referring to FIGS. 16A and 16B, a first dielectric layer 36 and an optional dielectric cap layer 40 are formed on the electrical fuse (51, 52, 53) and the semiconductor device. The first dielectric layer 36 and the optional dielectric cap layer 40 are lithographically patterned and etched to form an opening in the first dielectric layer 36 having a fifth lithographic width w5, which is lithographic dimension. A portion of the shallow trench isolation 20 is exposed at the bottom of the opening in the first dielectric layer 36 between the electrical fuse (51, 52, 53) and the semiconductor device.

Figure 17A:
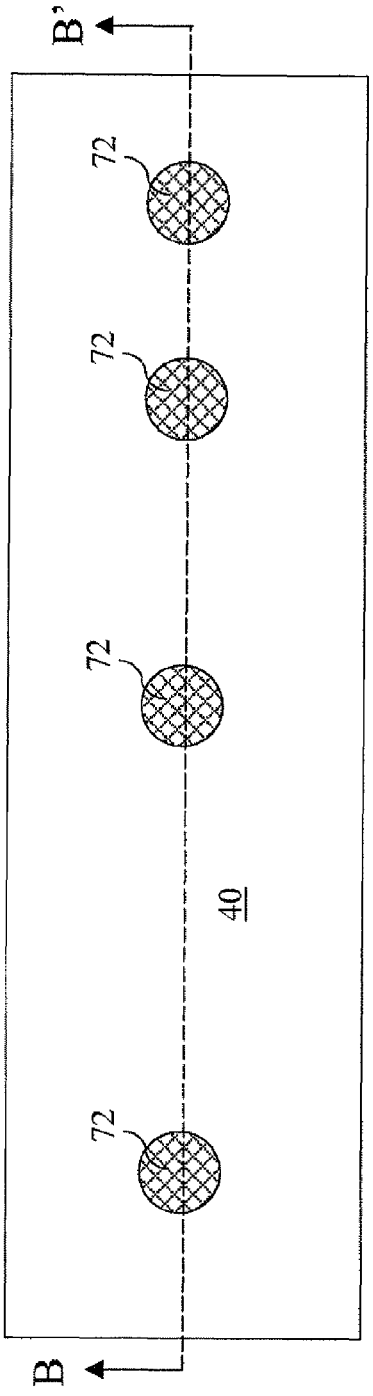
Figure 17B:
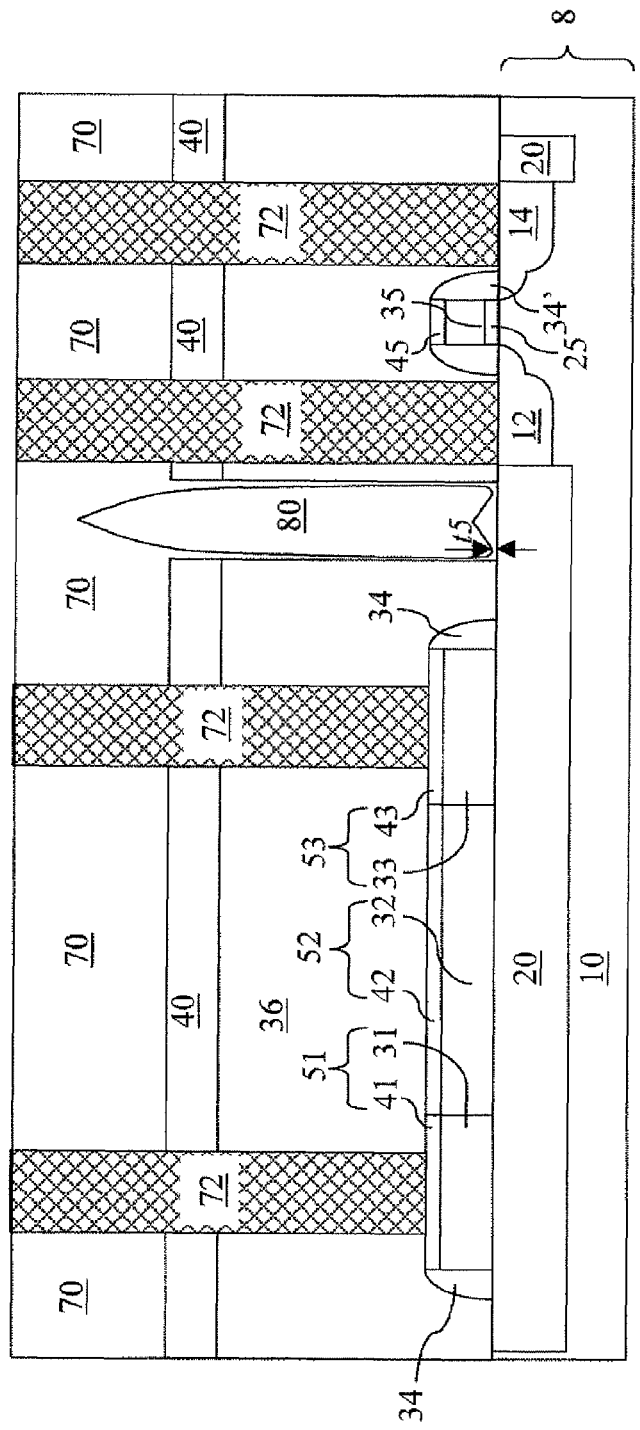

The same processing steps are employed thereafter in the third embodiment as in the first embodiment. The sixth exemplary structure in FIGS. 17A-17B comprises a cavity 80 located between the electrical fuse (51, 52, 53) and the semiconductor device. The cavity 80 is separated from the shallow trench isolation 20 by a fifth thickness t5 which may be a sublithographic dimension. The fifth thickness t5 is the minimum thickness of the second dielectric layer 70 between the shallow trench isolation 20 and the cavity 80. The cavity 80 is separated from sidewalls of the opening in the first dielectric layer 36 by a portion of the second dielectric layer 70 that extends from the top of the opening to the shallow trench isolation 20. The cavity 80 provides enhanced thermal isolation between the electrical fuse (51, 52, 53) and the semiconductor device.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    an electrical fuse comprising a first electrode, a second electrode, and a fuselink, and located on shallow trench isolation in a semiconductor substrate, wherein each of said first electrode, said second electrode, and said fuselink comprises a conductive material;
    a cavity located on and above said fuselink; and
    a dielectric layer encapsulating said cavity and vertically abutting said fuselink.

2. The semiconductor structure of claim 1, wherein said at least one cavity is separated from said fuselink by a sublithographic dimension.

3. The semiconductor structure of claim 1, further comprising another dielectric layer vertically abutting said electrical fuse and containing an opening that extends to a top surface of said electrical fuse and laterally abuts said dielectric layer.

4. The semiconductor structure of claim 1, further comprising a dielectric spacer laterally abutting sidewalls of said electrical fuse, wherein said cavity is located above a portion of said dielectric spacer.

5. The semiconductor structure of claim 4, wherein said at least one cavity is located above a portion of said shallow trench isolation.

6. The semiconductor structure of claim 4, wherein said cavity is separated from said dielectric spacer by a sublithographic dimension.

7. A semiconductor structure comprising:
   an electrical fuse comprising a first electrode, a second electrode, and a fuselink, and located on shallow trench isolation in a semiconductor substrate, wherein each of said first electrode, said second electrode, and said fuselink comprises a conductive material;
   at least one cavity located in proximity to said electrical fuse and above said shallow trench isolation; and
   a dielectric layer encapsulating said at least one cavity and vertically abutting said shallow trench isolation.

8. The semiconductor structure of claim 7, further comprising a dielectric spacer located on sidewalls of said electrical fuse, wherein said at least one cavity is separated from said electrical fuse by a distance not exceeding the sum of a width of said fuselink and twice a width of said dielectric spacer.

9. The semiconductor structure of claim 7, further comprising a semiconductor device laterally abutting said shallow trench isolation, wherein said at least one cavity is located between said electrical fuse and said semiconductor device.

10. The semiconductor structure of claim 7, wherein said at least one cavity laterally surrounds said electrical fuse.

11. The semiconductor structure of claim 10, wherein said at least one cavity is located over at least a portion of said fuselink.

12. The semiconductor structure of claim 7, wherein said at least one cavity is a pair of cavities located on both sides of said fuselink.

* * * * *